(12) United States Patent
Wang

(10) Patent No.: US 7,070,418 B1
(45) Date of Patent: Jul. 4, 2006

(54) LIGHT EMITTING DIODE ASSEMBLY

(75) Inventor: Tiger Wang, Taipei (TW)

(73) Assignee: Keeper Technology Co., Ltd., Taipei (TW)

( * ) Notice: Subject to any disclaimer, the term of this patent is extended or adjusted under 35 U.S.C. 154(b) by 20 days.

(21) Appl. No.: 11/138,982

(22) Filed: May 26, 2005

(51) Int. Cl.
*H01R 12/00* (2006.01)

(52) U.S. Cl. ..................................... 439/56

(58) Field of Classification Search ............ 439/56, 439/57, 58; 362/646, 436, 438, 226; 361/807
See application file for complete search history.

(56) References Cited

U.S. PATENT DOCUMENTS

| | | | | |
|---|---|---|---|---|
| 4,547,840 A | * | 10/1985 | Tinder | 439/56 |
| 5,116,229 A | * | 5/1992 | Savage, Jr. | 439/56 |
| 6,623,282 B1 | * | 9/2003 | Boyd | 439/56 |

\* cited by examiner

*Primary Examiner*—Tho D. Ta
(74) *Attorney, Agent, or Firm*—Alan D. Kamrath; Nikolai & Mersereau, P.A.

(57) ABSTRACT

A light emitting diode (LED) assembly has a printed circuit board, multiple conductors and multiple light emitting diodes (LEDs). The printed circuit board has multiple mounting holes. The conductors are mounted on the PCB and serve respectively as positive electrode conductors and negative electrode conductors. Each conductor has a contact pin and at least one through hole with an inner edge. Each LED is mounted on the positive electrode conductor and the negative electrode conductor and has a die and two contact tabs. Each contact tab has a through hole having an inner edge and multiple hooks extending from the inner edge of the through hole in the contact tab and hooking the inner edge of the at least one through hole in the conductor. Consequently, neither solder nor welding is required to assemble the LED assembly.

2 Claims, 5 Drawing Sheets

LIGHT EMITTING DIODE ASSEMBLY

BACKGROUND OF THE INVENTION

1. Field of the Invention

The present invention relates to light emitting diodes, and more particularly to a light emitting diode assembly having multiple light emitting diodes incorporated without solder or welding.

2. Description of Related Art

Light emitting diodes (LEDs) are compact, have low power consumption and are widely used now.

A conventional method for mounting an LED with a die, a positive contact pin and a negative contact pin on a printed circuit board (PCB) with multiple mounting holes and contact points comprises two steps. The steps are mounting the contact pins of the LED through the mounting holes in the PCB and soldering the contact pins to contact points on the PCB. However, soldering the contact pins and the contact points easily causes excess heat to burn the die of the LED.

Another conventional method for mounting the LED with two metal conductors on the PCB comprises three steps of bending the contact pins 90°, welding the contact pins respectively to the conductors and mounting the conductor in the mounting holes in the PCB. However, welding the contact pins and the conductors may cause excess heat to burn the die of the LED.

To overcome the shortcomings, the present invention provides a light emitting diode assembly to mitigate or obviate the aforementioned problems.

SUMMARY OF THE INVENTION

The main objective of the invention is to provide a light emitting (LED) assembly having multiple LEDs mounted together without solder or welding that may cause excess heat to burn dies of the LEDs.

The LED assembly in accordance with the present invention comprises a printed circuit board, multiple conductors and multiple light emitting diodes (LEDs).

The printed circuit board has multiple mounting holes.

The conductors are mounted on the PCB and serve respectively as positive electrode conductors and negative electrode conductors. Each conductor has a contact pin and at least one through hole with an inner edge.

Each LED is mounted on the positive electrode conductor and the negative electrode conductor and has a die and two contact tabs. Each contact tab has a through hole having an inner edge and multiple hooks extending from the inner edge of the through hole in the contact tab and hooking the inner edge of the at least one through hole in the conductor.

Other objectives, advantages and novel features of the invention will become more apparent from the following detailed description when taken in conjunction with the accompanying drawings.

DETAILED DESCRIPTION OF PREFERRED EMBODIMENT

Figure 1:
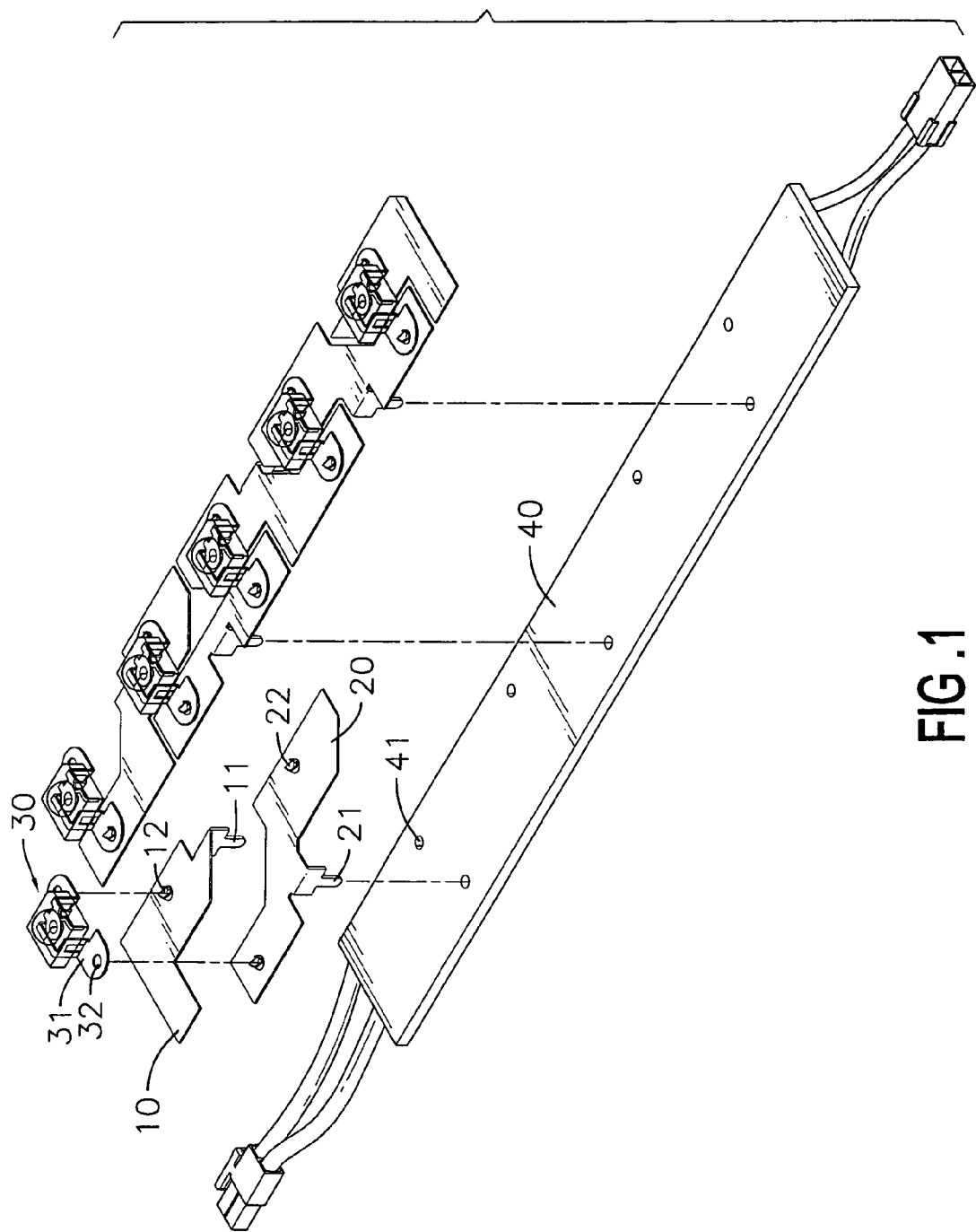
FIG. 1 is an exploded perspective view of a first embodiment of a light emitting diode (LED) assembly in accordance with the present invention.

With reference to FIG. 1, a first embodiment of a light emitting diode (LED) assembly in accordance with the present invention comprises a printed circuit board (PCB) (40), multiple conductors (10, 20) and multiple light emitting diodes (LEDs) (30).

The PCB (40) has multiple mounting holes (41). The mounting holes (41) are defined through the PCB (40).

Figure 2:
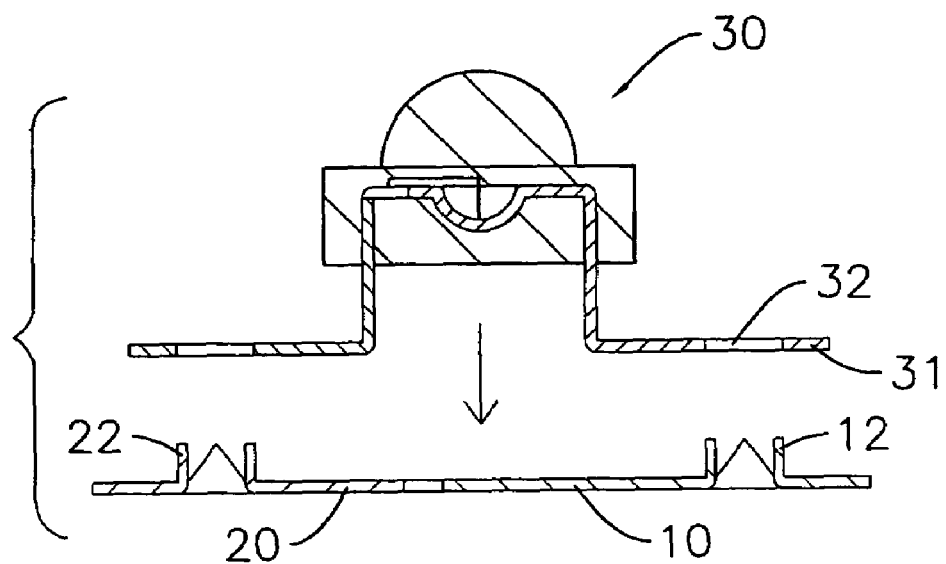
FIG. 2 is an operational cross-sectional side view of the LED assembly in FIG. 1 being assembled.

With reference to FIG. 2, the conductors (10, 20) are made of conductive material, are mounted on the PCB (40) and serve respectively as positive electrode conductors (10) and negative electrode conductors (20). Each conductor (10, 20) has a contact pin (11, 21), at least one through hole and at least one set of multiple protruding tabs (12, 22). The contact pin (11, 21) is formed perpendicularly on the conductor (10, 20) and extends into the mounting hole (41) in the PCB (40). The at least one through hole is defined through the conductor (10, 20) and has an inner edge. The protruding tabs (12, 22) of each set extend perpendicularly from the inner edge of the at least one through hole in the conductor (10, 20).

The LEDs (30) are mounted respectively on the conductors (10, 20). Each LED (30) is mounted on a positive electrode conductor (10) and an adjacent negative electrode conductor (20) and has a die and two contact tabs (31). The contact tabs (31) are made of conductive material, are connected to the die, extend out from the LED (30), and serve respectively as a positive electrode and a negative electrode corresponding to adjacent positive and negative electrode conductors (10, 20). Each contact tab (31) has a through hole (32) defined through the contact tab (31). Each through hole (32) corresponds to the at least one set of the protruding tabs (12, 22) on the corresponding conductor and has an inner edge that the protruding tabs (12, 22) on the corresponding conductor (10, 20) abut.

Figure 3:
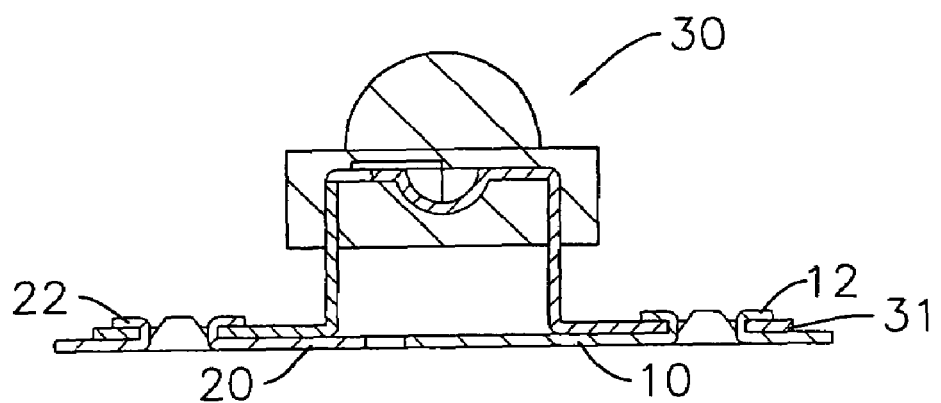
FIG. 3 is a cross-sectional side view of the LED assembly in FIG. 2.
Figure 4:
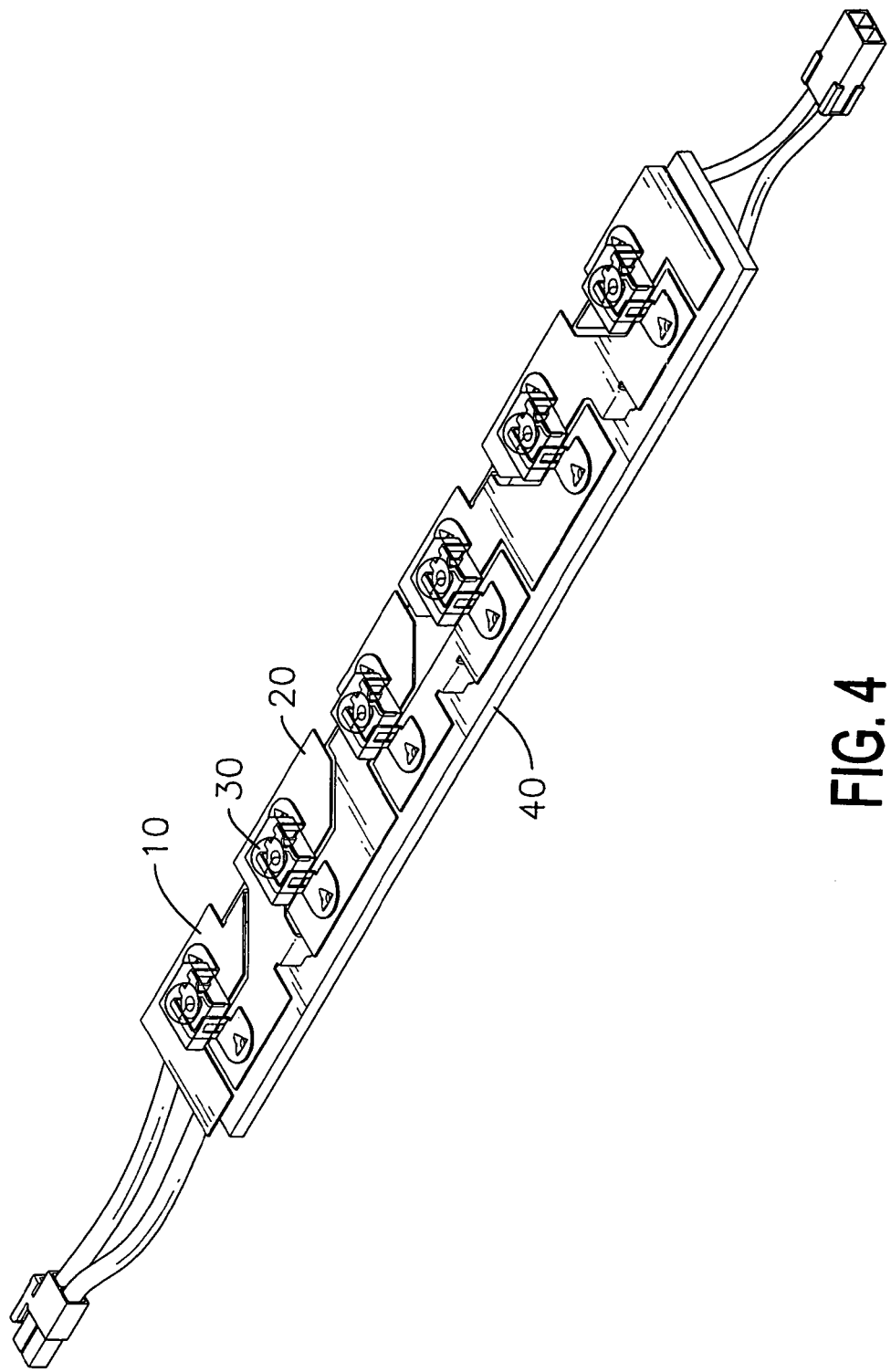
FIG. 4 is a perspective view of the LED assembly in FIG. 1.

With reference to FIGS. 3 and 4, the protruding tabs (12, 22) of each set on each conductor (10, 20) are bent to form hooks. The hooks hook the inner edge of the through hole in the corresponding contact tab (31) on the LED (30) to securely hold the LED (30). Consequently, neither solder nor welding is required to assemble the LED assembly.

Figure 5:
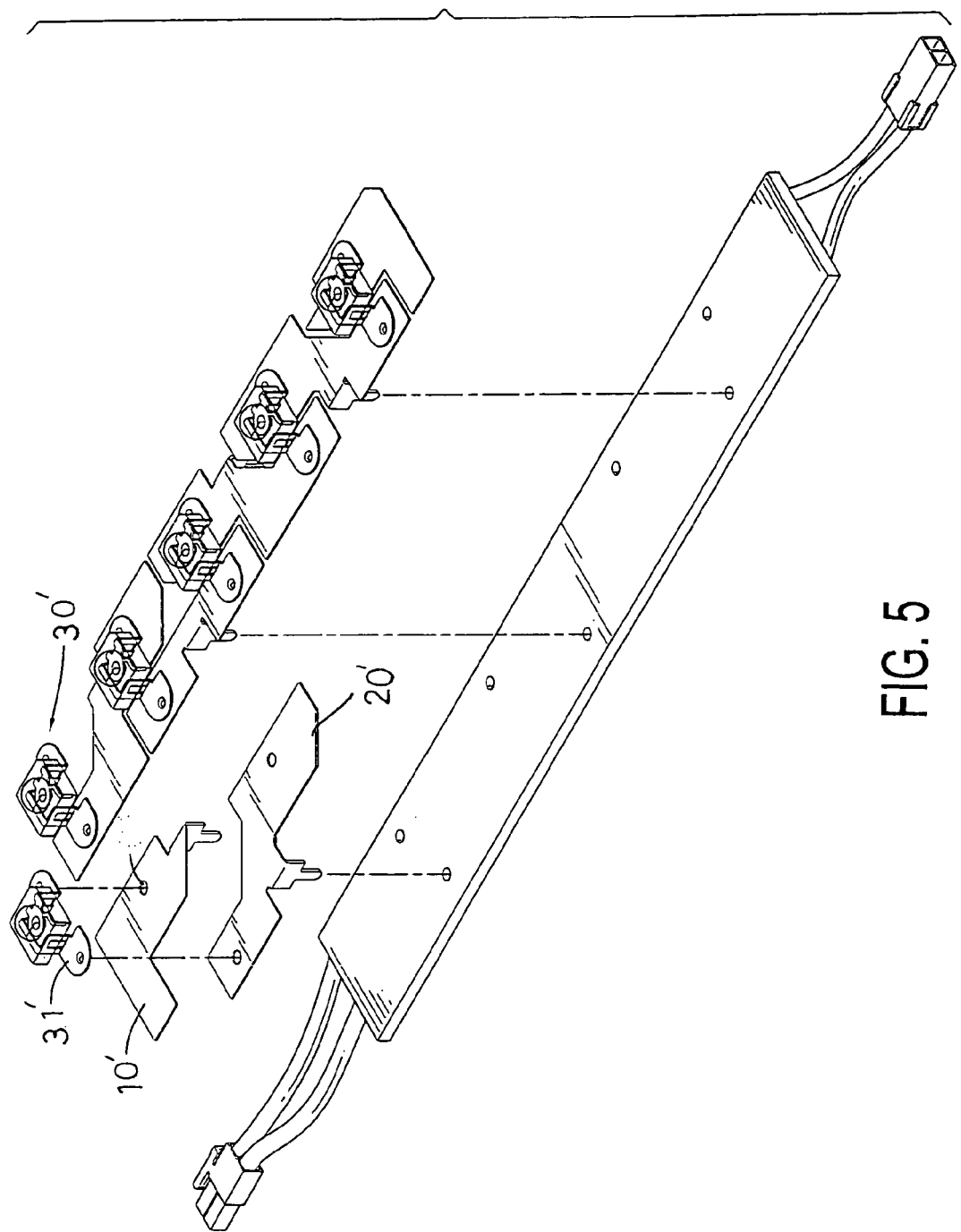
FIG. 5 is an exploded perspective view of a second embodiment of a LED assembly in accordance with the present invention.
Figure 6:
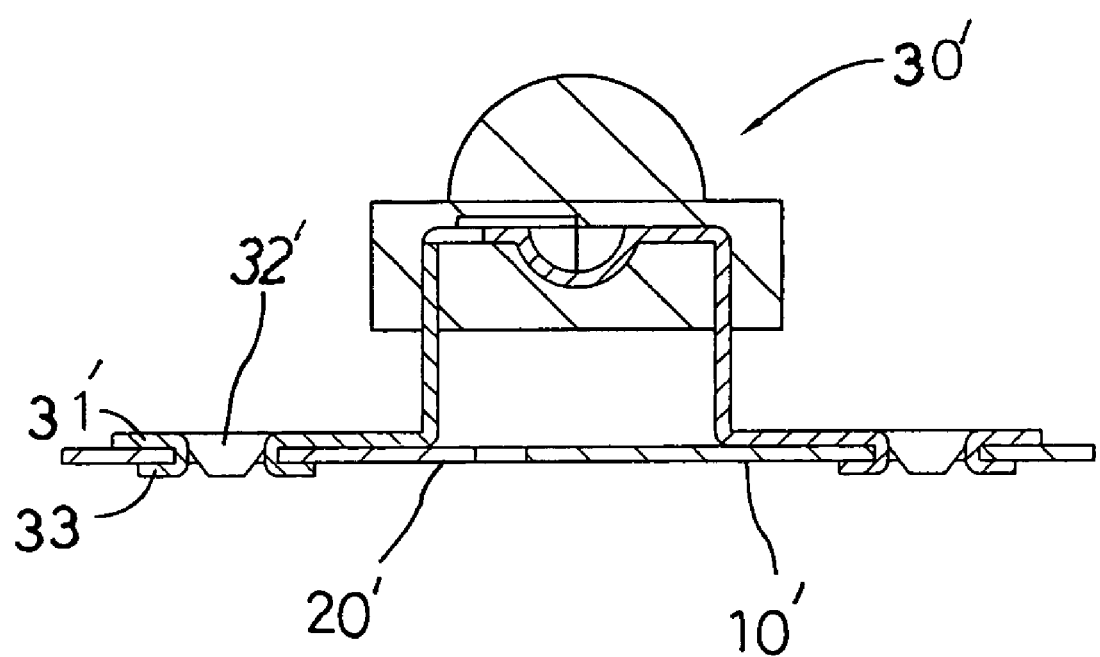
FIG. 6 is a cross-sectional side view of the LED assembly in FIG. 5.

With further reference to FIG. 5, a second embodiment of the LED assembly in accordance with the present invention is similar to the first embodiment. With further reference to FIG. 6, each LED (30') has two sets of protruding tabs (33) extending from the inner edges of the through holes in the contact tabs (31') and corresponding to the through holes in the corresponding conductors (10', 20'). The conductors (10', 20') in the second embodiment are implemented without the protruding tabs (12, 22).

The LEDs (30') are attached to the conductors (10', 20') by inserting the protruding tabs (33) on the contact tabs (31') of the LED (30') respectively into the through holes in the conductors (10', 20') and bending the protruding tabs (33) outward to hooks the inner edges of the through holes.

Consequently, neither solder nor welding is required to assemble the LED assembly so no excess heat exists to burn the dies in the LEDs. Therefore, the production yield of the LED assembly is improved.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A light emitting diode (LED) assembly comprising:
   a printed circuit board (PCB) having multiple mounting holes defined through the PCB;
   multiple conductors mounted on the PCB and serving respectively as positive electrode conductors and negative electrode conductors, and each conductor having
      a contact pin formed perpendicularly on the conductor and extending into one of the mounting holes in the PCB;
      at least one through hole defined through the conductor and having an inner edge; and
      at least one set of multiple hooks extending perpendicularly from the inner edge of the at least one through hole in the conductor; and
   multiple LEDs mounted on the conductors, and each LED mounted on a positive electrode conductor and an adjacent negative electrode conductor and having
      a die; and
      two contact tabs made of conductive material, connected to the die, extending out from the LED and serving respectively as a positive electrode and a negative electrode corresponding to adjacent positive and negative electrode conductors, and each contact tab having a through hole defined through the contact tab, and each through hole corresponding to one of the at least one through hole in the corresponding conductor and having an inner edge that the hooks on the corresponding through hole abut and hook.

2. An LED assembly comprising:
   a PCB having multiple mounting holes defined through the PCB;
   multiple conductors mounted on the PCB and serving respectively as positive electrode conductors and negative electrode conductors, and each conductor having
      a contact pin formed perpendicularly on the conductor and extending in one of the mounting holes in the PCB; and
      at least one through hole defined through the conductor and having an inner edge; and
   multiple LEDs mounted on the conductors, and each LED mounted on a positive and an adjacent negative electrode conductors and having
      a die; and
      two contact tabs connected to the die and extending out from the LED serving respectively as a positive electrode and a negative electrode corresponding to adjacent positive electrode conductor and negative electrode conductor, and each contact tab having
         a through hole defined through the contact tab and having an inner edge; and
         multiple hooks extending perpendicularly from the inner edge of the through hole in the contact tabs, corresponding respectively to the at least one through hole in the corresponding conductor and hooking the inner edge of the corresponding through hole in the corresponding conductor.

* * * * *